(12) United States Patent
Nishiwaki (10) Patent No.: US 9,761,681 B2
(45) Date of Patent: Sep. 12, 2017

(54) SEMICONDUCTOR DEVICE

(71) Applicant: TOYOTA JIDOSHA KABUSHIKI KAISHA, Toyota-shi, Aichi-ken (JP)

(72) Inventor: Katsuhiko Nishiwaki, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 15/303,597

(22) PCT Filed: Mar. 27, 2015

(86) PCT No.: PCT/JP2015/059721
§ 371 (c)(1),
(2) Date: Oct. 12, 2016

(87) PCT Pub. No.: WO2015/182233
PCT Pub. Date: Dec. 3, 2015

(65) Prior Publication Data
US 2017/0069729 A1    Mar. 9, 2017

(30) Foreign Application Priority Data

May 26, 2014    (JP) ................................. 2014-107824

(51) Int. Cl.
| | |
|---|---|
| *H01L 29/423* | (2006.01) |
| *H01L 27/02* | (2006.01) |
| *H01L 27/088* | (2006.01) |
| *H01L 29/49* | (2006.01) |
| *H01L 29/739* | (2006.01) |

(Continued)

(52) U.S. Cl.
CPC ...... *H01L 29/4236* (2013.01); *H01L 27/0207* (2013.01); *H01L 27/088* (2013.01); *H01L 29/0696* (2013.01); *H01L 29/0865* (2013.01); *H01L 29/12* (2013.01); *H01L 29/423* (2013.01); *H01L 29/42376* (2013.01);
(Continued)

(58) Field of Classification Search
CPC  H01L 29/4236; H01L 27/0207; H01L 27/088
USPC .................................................. 257/331, 341
See application file for complete search history.

(56) References Cited

U.S. PATENT DOCUMENTS

| | | | |
|---|---|---|---|
| 2008/0012040 A1 | 1/2008 | Saito et al. | |
| 2014/0054645 A1* | 2/2014 | Saito ................... | H01L 29/0696 257/139 |
| 2015/0295079 A1 | 10/2015 | Nakano et al. | |

FOREIGN PATENT DOCUMENTS

| | | |
|---|---|---|
| JP | 2012-190938 A | 10/2012 |
| JP | 2013-149836 A | 8/2013 |

(Continued)

*Primary Examiner* — Cuong Q Nguyen
*Assistant Examiner* — Tong-Ho Kim
(74) *Attorney, Agent, or Firm* — Oliff PLC (57) ABSTRACT

The semiconductor device includes a gate insulation film covering inner surfaces of the first trench and the second trench, and an inner surface of an intersection, and a gate electrode provided in the first trench and the second trench, and facing the semiconductor substrate via the gate insulation film. Further, the semiconductor device includes an emitter region of an n-type provided in the semiconductor substrate, exposed on the front surface of the semiconductor substrate, being in contact with the gate insulation film in the second trench, and not being in contact with the gate insulation film provided on the inner surface of the intersection of the first trench and the second trench.

3 Claims, 5 Drawing Sheets (51) Int. Cl.
  *H01L 29/12* (2006.01)
  *H01L 29/78* (2006.01)
  *H01L 29/06* (2006.01)
  *H01L 29/08* (2006.01)

(52) U.S. Cl.
  CPC ............ *H01L 29/49* (2013.01); *H01L 29/739* (2013.01); *H01L 29/7813* (2013.01)

(56) References Cited

FOREIGN PATENT DOCUMENTS

| JP | 2013-232533 A | 11/2013 |
|----|---------------|---------|
| WO | 2005/109521 A1 | 11/2005 |

\* cited by examiner

SEMICONDUCTOR DEVICE

TECHNICAL FIELD

The present disclosure relates to a semiconductor device.

BACKGROUND ART

Patent Document 1 (Japanese Patent Application Publication No. 2013-232533) discloses a semiconductor device having a semiconductor substrate, and a plurality of trenches provided in the semiconductor substrate. In the semiconductor device of the Patent Document 1, the trenches are arranged in an offset grid-like pattern.

SUMMARY

Technical Problem

In the semiconductor device of the Patent Document 1, differences may be generated among threshold voltages that are required for forming channels depending on positions of a gate electrode. Thus, in this description, a semiconductor device that can stabilize the threshold voltage is to be provided.

Solutions to Technical Problem

A semiconductor device disclosed herein comprises a first trench provided in a front surface of a semiconductor substrate, and a second trench provided in the front surface, extending in a direction different from a direction of the first trench, and intersecting the first trench in a plan view of the front surface. Further, the semiconductor device comprises a gate insulation film covering inner surfaces of the first trench and the second trench, and an inner surface of an intersection of the first trench and the second trench, and a gate electrode provided in the first trench and the second trench, and facing the semiconductor substrate via the gate insulation film. Further, the semiconductor device comprises a first semiconductor region of a first conductive type provided in the semiconductor substrate, exposed on the front surface, being in contact with the gate insulation film in the second trench, and not being in contact with the gate insulation film covering the inner surface of the intersection of the first trench and the second trench. Further, the semiconductor device comprises a second semiconductor region of a second conductive type provided in the semiconductor substrate, and being in contact with the gate insulation film in the second trench on a deeper side than the first semiconductor region. Further, the semiconductor device comprises a third semiconductor region of the first conductive type provided in the semiconductor substrate, being in contact with the gate insulation film in the second trench on a deeper side than the second semiconductor region, and separated from the first semiconductor region by the second semiconductor region.

The trench becomes deeper at the intersection where the first trench and the second trench intersect than in other surrounding portions. However, according to the above configuration, the first semiconductor region is not in contact with the gate insulation film provided in the intersection, thus an influence by the deep trench at the intersection can be avoided. As a result, a threshold voltage of the semiconductor device can be stabilized.

DETAILED DESCRIPTION

Some of the features characteristic to below-described embodiments will herein be listed. It should be noted that the respective technical elements are independent of one another, and are useful solely or in combinations.

(Feature 1) A semiconductor device may comprise a plurality of first trenches and a plurality of second trenches. The plurality of the first trenches and the plurality of the second trenches may be arranged in a grid-like pattern in a plan view of a front surface of a semiconductor substrate. A first semiconductor region may not be in contact with a gate insulation film in the first trenches.

(Feature 2) Grids formed by the first trenches and the second trenches may be arranged in a staggered pattern in the plan view of the front surface of the semiconductor substrate.

Figure 1:
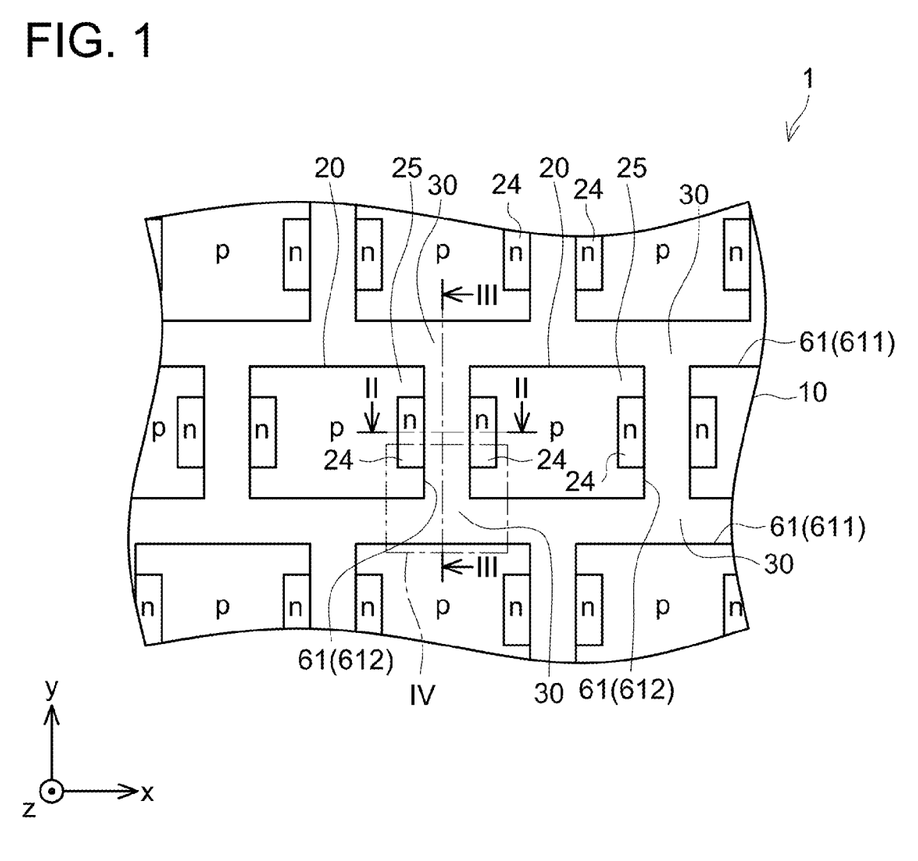
FIG. 1 is a plan view of a semiconductor device.
Figure 2:
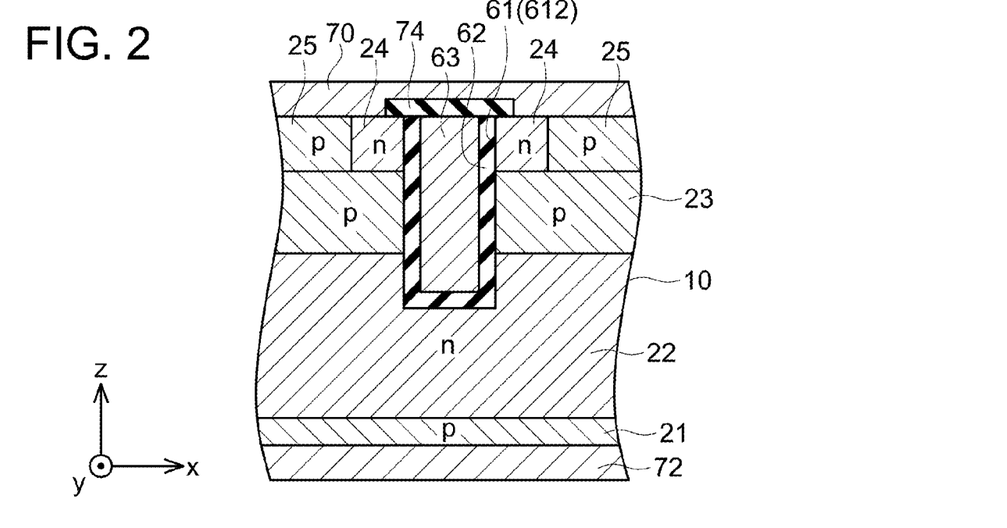
FIG. 2 is a cross sectional view along II-II in FIG. 1.
Figure 3:
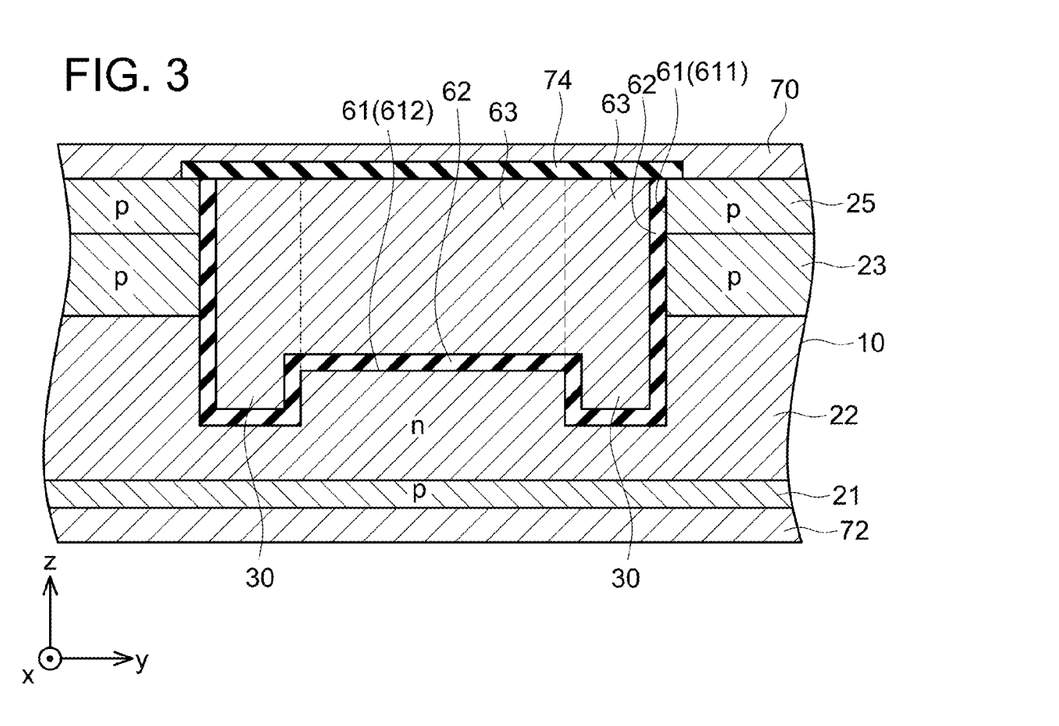
FIG. 3 is a cross sectional view along III-III in FIG. 1.

Hereinbelow, embodiments will be described with reference to the attached drawings. A semiconductor device 1 shown in FIGS. 1 to 3 is an IGBT (Insulated Gate Bipolar Transistor). The semiconductor device 1 comprises a semiconductor substrate 10, electrodes, insulating layers, and the like.

The semiconductor substrate 10 is constituted of silicon (Si). In other embodiments, the semiconductor substrate 10 may be constituted of silicon carbide (SiC), gallium nitride (GaN), or the like. As shown in FIG. 2, the semiconductor substrate 10 comprises emitter regions 24 (corresponding to an example of a first semiconductor region), contact regions 25, body regions 23 (corresponding to an example of a second semiconductor region), a drift region 22 (corresponding to an example of a third semiconductor region), and a collector region 21 provided therein. More specifically, the semiconductor substrate 10 comprises, in this order from its rear surface side, the p-type collector region 21, the n-type drift region 22 provided on the collector region 21, the p-type body regions 23 provided on the drift region 22, the n-type emitter regions 24 provided on the body regions 23, and the p-type contact regions 25 provided on the body regions 23. The collector region 21 is exposed on a rear surface of the semiconductor substrate 10. The collector region 21 is separated from the body regions 23 by the drift region 22. The drift region 22 is separated from the emitter regions 24 by the body regions 23. The emitter regions 24 are exposed on a front surface of the semiconductor substrate 10. The contact regions 25 are exposed on the front surface of the semiconductor substrate 10. A p-type impurity concentration of the contact regions 25 is higher than a p-type impurity concentration of the body regions 23. Notably, the n-type corresponds to an example of a first conductive type, and the p-type corresponds to an example of a second conductive type.

A front surface electrode 70 is provided on the front surface of the semiconductor substrate 10. The front surface electrode 70 is connected to the emitter regions 24 and the contact regions 25. A rear surface electrode 72 is provided on the rear surface of the semiconductor substrate 10. The rear surface electrode 72 is connected to the collector region 21.

As shown in FIG. 1, the front surface of the semiconductor substrate 10 is provided with a plurality of trenches 61 (that is, a plurality of first trenches 611 and a plurality of second trenches 612). In a plan view of the front surface of the semiconductor substrate 10, the first trenches 611 extend along an x direction (a first direction). In the plan view of the front surface of the semiconductor substrate 10, the plurality of the first trenches 611 is provided aligning along a y direction with intervals between each other. Notably, the y direction is a direction different from the x direction, and more specifically, the y direction is a direction orthogonally intersecting with the x direction. The plurality of the first trenches 611 extends parallel to each other. The second trenches 612 extend along the y direction (a second direction). The plurality of the second trenches 612 is provided aligning along the x direction with intervals between each other. The plurality of the second trenches 612 extends parallel to each other. The second trenches 612 that are adjacent in the y direction are offset from each other in the x direction. Each second trench 612 is provided between two first trenches 611. Each of the second trenches 612 intersects with the first trenches 611 at its both ends (at intersections 30 in FIG. 1). The trenches 61 extend in three directions from each intersection 30. The front surface of the semiconductor substrate 10 is partitioned into a grid-like pattern by the first trenches 611 and the second trenches 612. Grids formed by the first trenches 611 and the second trenches 612 are arranged so as to be in a staggered pattern. Hereinbelow, regions partitioned in the grid-like pattern will be termed element regions 20.

As shown in FIG. 1, the emitter regions 24 are provided in respective element regions 20. The emitter regions 24 are adjacent to corresponding second trenches 612. The emitter regions 24 are provided along the corresponding second trenches 612. The emitter regions 24 extend in the y direction (the second direction). The emitter regions 24 are provided on both sides of each second trench 612 in the x direction. The emitter regions 24 on both sides of each second trench 612 are provided symmetrically with the second trench 612 between those emitter regions 24. The emitter regions 24 are not adjacent to the first trenches 611. Further, the emitter regions 24 are not adjacent to the intersections 30. That is, the emitter regions 24 are arranged so as to be separated from the first trenches 611 as well as from the intersections 30. The contact regions 25 are arranged so as to be in contact with corresponding first trenches 611, second trenches 612, and intersections 30. That is, each contact region 25 is arranged between corresponding emitter regions 24 and first trenches 611.

Figure 4:
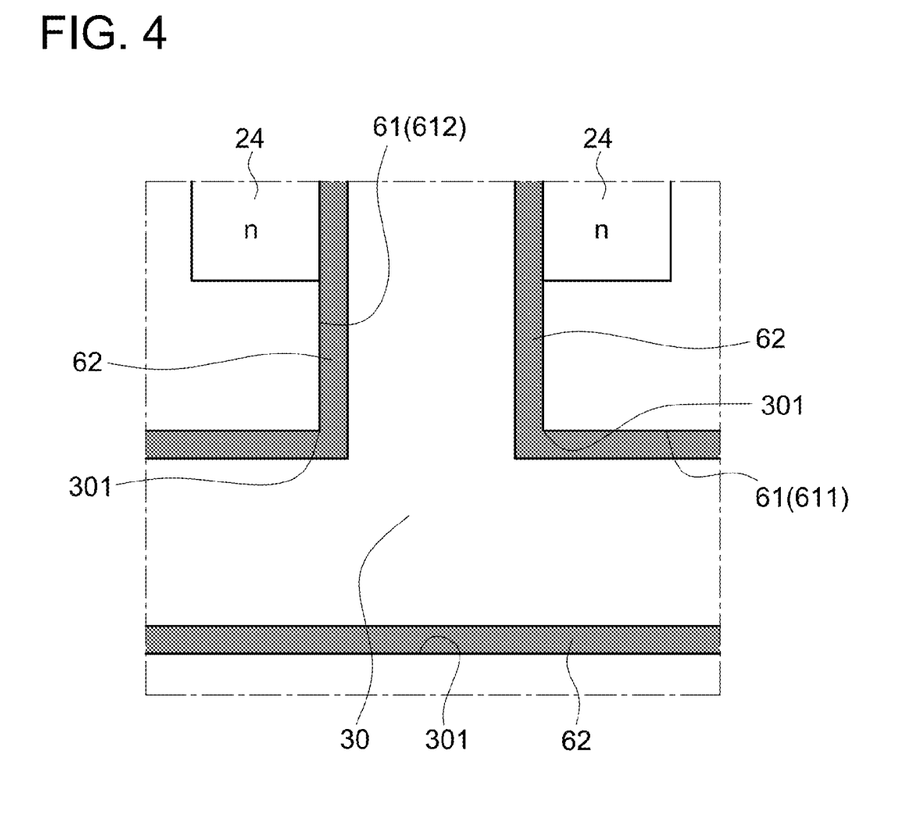
FIG. 4 is an enlarged view of a primary portion IV in FIG. 1.

As shown in FIGS. 2 and 3, in a cross sectional view, the trenches 61 (the first trenches 611 and the second trenches 612) extend from the front surface of the semiconductor substrate 10 in a z direction (a depth direction). The first trenches 611 penetrate the emitter regions 24 and the body regions 23, and reach the drift region 22. The second trenches 612 penetrate the contact regions 25 and the body regions 23, and reach the drift region 22. As shown in FIG. 3, in the intersections 30, a depth of the trenches 61 is made deeper compared to outside of the intersections 30. This is because upon forming the trenches 61 by dry etching in a manufacturing process of the semiconductor device 10, an amount of etching gas to be supplied to the intersections 30 becomes larger than that for the trenches 61 outside of the intersections 30. A gate insulation film 62 is provided on inner surfaces of the trenches 61. The gate insulation film 62 covers an entirety of the inner surfaces of the trenches 61. A gate electrode 63 is provided inside the respective trenches 61 (an inner side of the gate insulation film 62). The gate electrode 63 is arranged inside the first trenches 611 as well as inside the second trenches 612. The gate electrode 63 opposes the semiconductor substrate 10 via the gate insulation film 62. The gate electrode 63 is insulated from the front surface electrode 70 by an interlayer insulation film 74. Further, as shown in FIG. 4, the gate insulation film 62 covers the inner surfaces of the first and second trenches 611, 612 as well as the inner surfaces of the intersections 30 of the first and second trenches 611, 612. In this embodiment, an inner surface 301 of each intersection 30 corresponds to an inner surface of a portion (corner) where ends of the first trenches 611 and an end of the corresponding second trench 612 make contact. Further, the inner surface 301 of each intersection 30 corresponds to inner surfaces of portions of the first trenches 611 that oppose the second trench 612 extending towards the first trenches 611. This inner surface 301 faces the corresponding intersection 30.

The contact regions 25, the emitter regions 24, the body regions 23, and the drift region 22 are in contact with the gate insulation film 62. As shown in FIG. 2, the emitter regions 24 are in contact with the gate insulation film 62 in a vicinity of the front surface of the semiconductor substrate 10. As shown in FIG. 3, the contact regions 25 are in contact with the gate insulation film 62 in the vicinity of the front surface of the semiconductor substrate 10. As shown in FIG. 1, the contact regions 25 are in contact with the gate insulation film 62 in the corresponding first trenches 611, the corresponding second trenches 612, and the corresponding intersections 30. Further, the emitter regions 24 are in contact with the gate insulation film 62 inside the corresponding second trenches 612. The emitter regions 24 are not in contact with the gate insulation film 62 in the first trenches 611 and the intersections 30. As shown in FIG. 2, the body regions 23 are in contact below the emitter regions 24 with the gate insulation film 62 on a deeper side than the emitter regions 24. Further, as shown in FIG. 3, the body regions 23 are in contact below the contact regions 25 with the gate insulation film 62 on the deeper side than the contact regions 25. The drift region 22 is in contact below the body regions 23 with the gate insulation film 62 on a deeper side than the body regions 23.

According to the semiconductor device 1 comprising the aforementioned configuration, when the gate electrode 63 in the trenches 61 is brought to an ON potential (a potential equal to or greater than a threshold), channels are formed along the depth direction of the trenches 61 in the body regions 23 in a vicinity of the gate insulation film 62. Further, when a voltage is applied between the front surface electrode 70 and the rear surface electrode 72, electrons flow from an emitter region 24 side to the collector region 21 through the channels and the drift region 22. Further, holes flow from the collector region 21 to the contact regions 25 through the drift region 22 and the body regions 23. Accordingly, a current flows from the collector region 21 to the emitter regions 24. That is, the IGBT turns on.

As aforementioned, the trenches 61 are deeper in the intersections 30 than in other surrounding portions. During when the IGBT is on, the electrons flow easily in the vicinity of the trenches 61. Due to this, if vicinities of the intersections 30 where the trenches 61 are deep are used as main passages of the electrons, the threshold (that is, the gate potential required to form the channels) may vary between positions where the trenches 61 are deep (that is, in the vicinities of the intersections 30) and positions where the trenches 61 are shallow (that is, positions away from the intersections 30), resulting in threshold variations among IGBTs being large. To deal with this, the aforementioned semiconductor device 1 arranges the emitter regions 24 so as not to be adjacent to the gate insulation film 62 provided in the intersections 30. Due to this, in the semiconductor device 1, areas below the emitter regions 24 become the main passages of the electrons, and not so much electrons flow in the vicinities of the intersections 30. Due to this, an influence of the deep trenches 61 in the intersections 30 can be avoided. As a result, the threshold variations among the semiconductor devices 1 can be suppressed, and the threshold can be stabilized. Further, switching performance can be stabilized.

Further, if the vicinities of the intersections 30 are used as the main passages of the electron flow, the electron flow tends to concentrate in the vicinities of the intersections 30. However, in the aforementioned semiconductor device 1, the concentration of the current in the vicinities of the intersections 30 can be suppressed due to the emitter regions 24 not being adjacent to the intersections 30. Further, the current flows uniformly since the emitter regions 24 are arranged symmetrically with the corresponding second trench 612 therebetween. Due to this, a local heat generation at the intersections 30 can be suppressed. Further, the contact regions 25 can be secured at portions where the emitter regions 24 are separated from the intersections 30. Due to this, regions where the holes are to flow can be ensured, and fast speed switching is enabled.

Further, in the aforementioned semiconductor device 1, the plurality of the first trenches 611 and the plurality of the second trenches 612 are provided so that the plurality of the grids (element regions 20) is arranged in the staggered pattern. In this configuration, a variation may occur among depths of the first trenches 611 and the second trenches 612. In the configuration in which the main passages of the electron flow are generated along both of the first trenches 611 and the second trenches 612, the thresholds may vary among the electron passages along the first trenches 611 and the electron passages along the second trenches 612, depending on a difference in the depths between the first trenches 611 and the second trenches 612. However, in the aforementioned semiconductor device 1, the emitter regions 24 are not in contact with the gate insulation film 62 inside the first trenches 611. Due to this, an influence from the difference in the depths between the first trenches 611 and the second trenches 612 can be avoided, and the threshold voltage can be stabilized.

One embodiment of the present invention has been explained above, however, specific aspects are not limited to the above embodiment. In the following explanation, the same reference signs used in the above explanation are used here for the same configuration to omit the explanation thereof.

Figure 5:
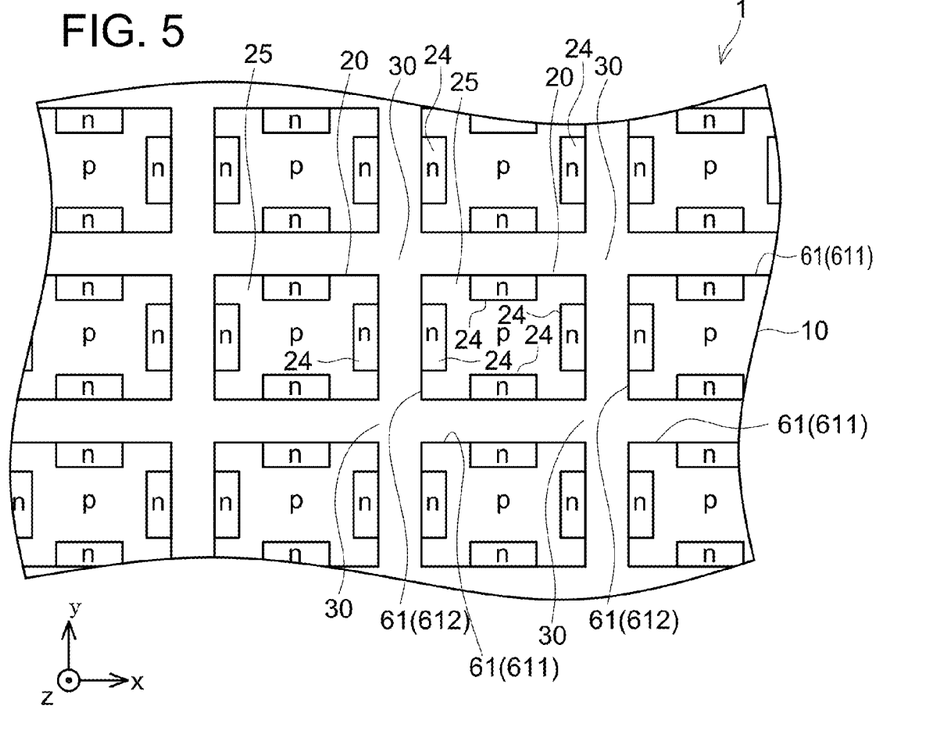
FIG. 5 is a plan view of a semiconductor device of another embodiment.

In the above embodiment, the plurality of the second trenches 612 is arranged in the staggered pattern, however, no limitation is made hereto. In another embodiment, as shown in FIG. 5, the plurality of the second trenches 612 may be provided so as to be aligned with each other along the y direction (the second direction). The plurality of the second trenches 612 are aligned in straight lines. The trenches 61 are extend in four directions from each intersection 30.

Further, in the above embodiment, the emitter regions 24 are adjacent to their corresponding second trenches 612 but are not adjacent to the first trenches 611, however, no limitation is made hereto. In another embodiment, as shown in FIG. 5, the emitter regions 24 may be adjacent to each of the corresponding first and second trenches 611, 612. The emitter regions 24 adjacent to the first trenches 611 are provided so as to be separated from the second trenches 612. The emitter regions 24 adjacent to the second trenches 612 are provided so as to be separated from the first trenches 611.

Figure 6:
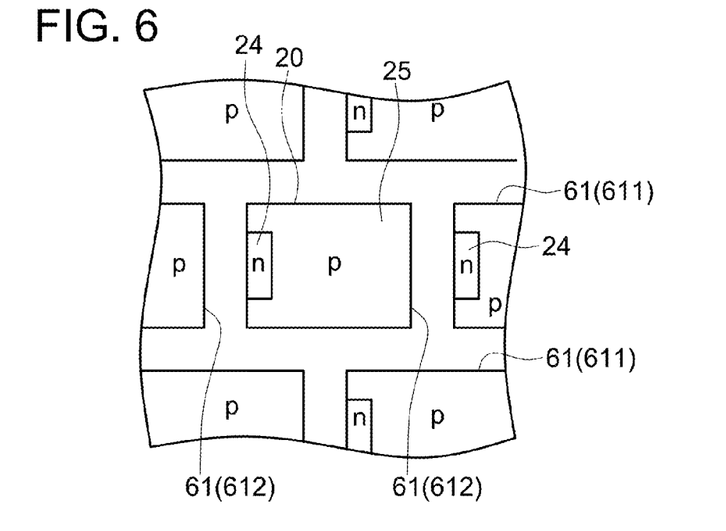
FIG. 6 is an enlarged view of a primary portion of a semiconductor device of yet another embodiment.

Further, in the above embodiment, the emitter regions 24 are provided symmetrically with the corresponding second trench 612 therebetween, however, no limitation is made hereto, and the emitter regions 24 may be provided asymmetrically. In another embodiment, as shown in FIG. 6, the emitter region 24 is provided on one side of each second trench 612 in the x direction, and no emitter region 24 is provided on another side thereof. According to this configuration, portions where the current flows can be scattered, and current concentration can be suppressed.

Figure 7:
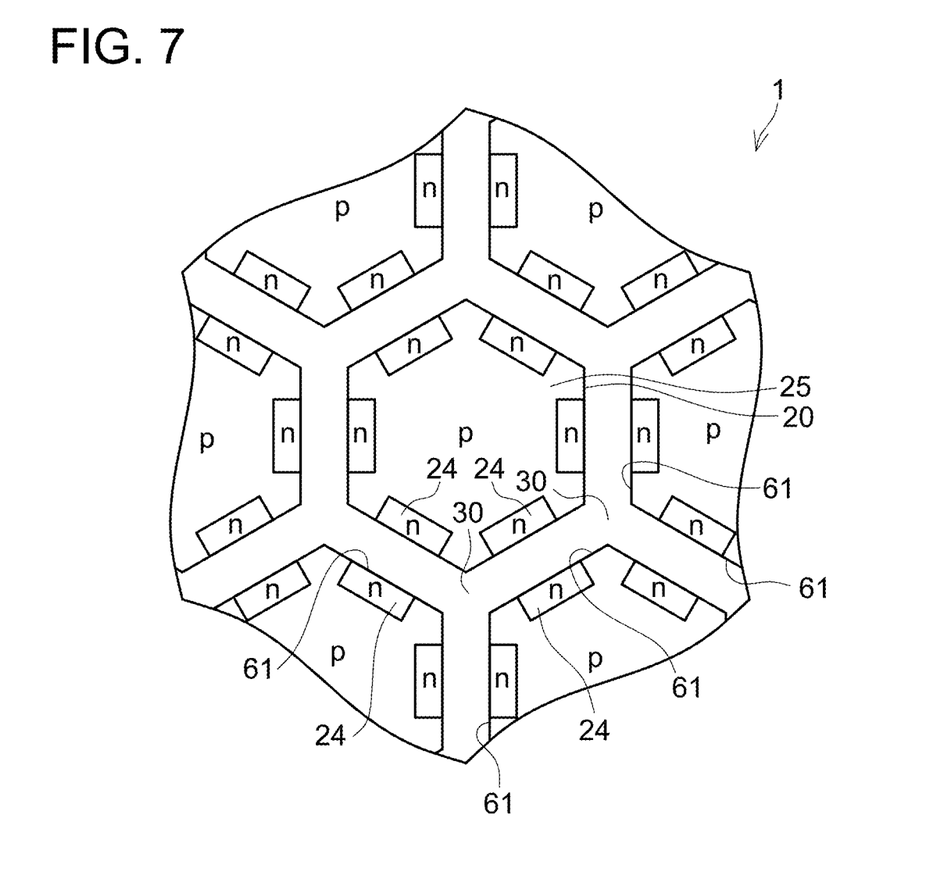
FIG. 7 is a plan view of a semiconductor device of yet another embodiment.

Further, in the above embodiment, the plurality of the trenches 61 is arranged in the grid-like pattern, however, no limitation is made hereto. In another embodiment, as shown in FIG. 7, the plurality of the trenches 61 may be arranged in a polygonal pattern. In an example shown in FIG. 7, the plurality of the trenches 61 is arranged in a hexagonal pattern. The plurality of the trenches 61 is arranged in a honeycomb pattern. The intersections 30 are provided at portions where the trenches 61 arranged in the hexagonal pattern intersect.

Further, in the above embodiment, the IGBT is provided in the semiconductor substrate 10, however, a MOSFET may be provided instead of the IGBT. In this case, for example, in the configuration of FIGS. 1 to 3, a structure in which an n-type high concentration region is provided instead of the collector region 21, and the high concentration region is electrically connected to the rear surface electrode 72 may be employed.

Specific examples of the present invention have been described in detail, however, these are mere exemplary indications and thus do not limit the scope of the claims. The art described in the claims include modifications and variations of the specific examples presented above. Technical features described in the description and the drawings may technically be useful alone or in various combinations, and are not limited to the combinations as originally claimed. Further, the art described in the description and the drawings may concurrently achieve a plurality of aims, and technical significance thereof resides in achieving any one of such aims.

REFERENCE SIGNS LIST

1; Semiconductor Device
10; Semiconductor Substrate
20; Element Region
21; Collector Region
22; Drift Region
23; Body Region
24; Emitter Region
25; Contact Region
30; Intersection
61; Trench
62; Gate Insulation Film
63; Gate Electrode
70; Front Surface Electrode
72; Rear Surface Electrode
74; Interlayer Insulation Film

The invention claimed is:

1. A semiconductor device comprising:
   a first trench provided in a front surface of a semiconductor substrate;
   a second trench provided in the front surface, extending in a direction different from a direction of the first trench, and intersecting the first trench in a plan view of the front surface, the second trench extending in the y direction in the plan view and having spaced-part edges extending the y-direction and spaced apart from each other in the x direction in the plan view;
   a gate insulation film covering inner surfaces of the first trench and the second trench, and an inner surface of an intersection of the first trench and the second trench, the gate insulating film comprising first and second portions covering the spaced apart edges of the second trench, extending in the y direction in plan view, and spaced apart in the x direction in the plan view;
   a gate electrode provided in the first trench and the second trench, and facing the semiconductor substrate via the gate insulation film;
   a first semiconductor region of a first conductive type provided in the semiconductor substrate, exposed on the front surface, being in contact with the gate insulation film in the second trench, and not being in contact with the gate insulation film covering the inner surface of the intersection of the first trench and the second trench;
   a second semiconductor region of a second conductive type provided in the semiconductor substrate, and being in contact with the gate insulation film in the second trench on a deeper side than the first semiconductor region; and
   a third semiconductor region of a first conductive type provided in the semiconductor substrate, being in contact with the gate insulation film in the second trench on a deeper side than the second semiconductor region, and separated from the first semiconductor region by the second semiconductor region,
   the first semiconductor region extending in the x direction from one of the first and second portions of the gate insulating film in the plan view, and the first semiconductor region not extending in the x direction from the other of the first and second portions of the gate insulating film in the plan view.

2. The semiconductor device according to claim 1, comprising:
   a plurality of the first trenches and a plurality of the second trenches, wherein
   the plurality of the first trenches and the plurality of the second trenches are arranged in a grid-like pattern in the plan view of the front surface, and
   the first semiconductor region is not in contact with the gate insulation film in the first trenches.

3. The semiconductor device according to claim 2, wherein
   grids formed by the first trenches and the second trenches are arranged in a staggered pattern in the plan view of the front surface.

* * * * *